United States Patent
Fischer et al.

(10) Patent No.: US 7,944,210 B2
(45) Date of Patent: May 17, 2011

(54) MAGNETIC RESONANCE RF TRANSMISSION ARRANGEMENT AND METHOD WITH COMMONLY FED LABELING AND EXCITATION ANTENNAS

(75) Inventors: Hubertus Fischer, Bamberg (DE); Helmut Kess, Erlangen (DE); Georg Rauh, Zirndorf (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 218 days.

(21) Appl. No.: 12/238,871

(22) Filed: Sep. 26, 2008

(65) Prior Publication Data
US 2009/0091326 A1    Apr. 9, 2009

(30) Foreign Application Priority Data

Sep. 26, 2007 (DE) .................. 10 2007 046 083
Nov. 29, 2007 (DE) .................. 10 2007 057 495

(51) Int. Cl.
*G01V 3/00* (2006.01)
(52) U.S. Cl. ........................... 324/318; 324/306
(58) Field of Classification Search .............. 324/318, 324/306
See application file for complete search history.

(56) References Cited

U.S. PATENT DOCUMENTS

| 7,439,742 B2 * | 10/2008 | Fontius et al. | 324/318 |
| 7,545,142 B2 * | 6/2009 | Alsop | 324/306 |
| 7,576,536 B2 * | 8/2009 | Akao et al. | 324/307 |
| 2009/0096456 A1 | 4/2009 | Biber et al. | |

OTHER PUBLICATIONS

"Continuous Arterial Spin Labeling with Separate Labeling and Imaging Coils: Implementation Using a Single RF Channel and Amplifier," Papadakis et al, Concepts in Magnetic Resonance Part B, vol. 29 B(3) (2006), pp. 145-152.
"Whole-Brain 3D Perfusion MRI at 3.0 T Using CASL With a Separate Labeling Coil," Talagala et al, Magnetic Resonance in Medicine, vol. 52 (2004) pp. 131-140.

* cited by examiner

Primary Examiner — Louis M Arana
(74) Attorney, Agent, or Firm — Schiff Hardin LLP

(57) ABSTRACT

A radio-frequency transmission device for a magnetic resonance system to generate magnetic resonance exposures of an examination region of an examination subject, has: a first radio-frequency transmission antenna that emits radio-frequency signals in the examination region, a radio-frequency amplifier that supplies the first radio-frequency transmission antenna, with radio-frequency signals with a predetermined radio-frequency transmission power, and a second radio-frequency transmission antenna fashioned to label a medium flowing in the examination region and/or examination regions via emission of labeling radio-frequency signals, such that the medium can be identified in the generated magnetic resonance exposures of the examination region. The second radio-frequency transmission antenna is coupled with the radio-frequency amplifier to supply the first radio-frequency transmission antenna, such that it likewise supplies the second radio-frequency transmission antenna with radio-frequency signals with a predetermined radio-frequency transmission power for the emission of radio-frequency labeling signals.

12 Claims, 3 Drawing Sheets

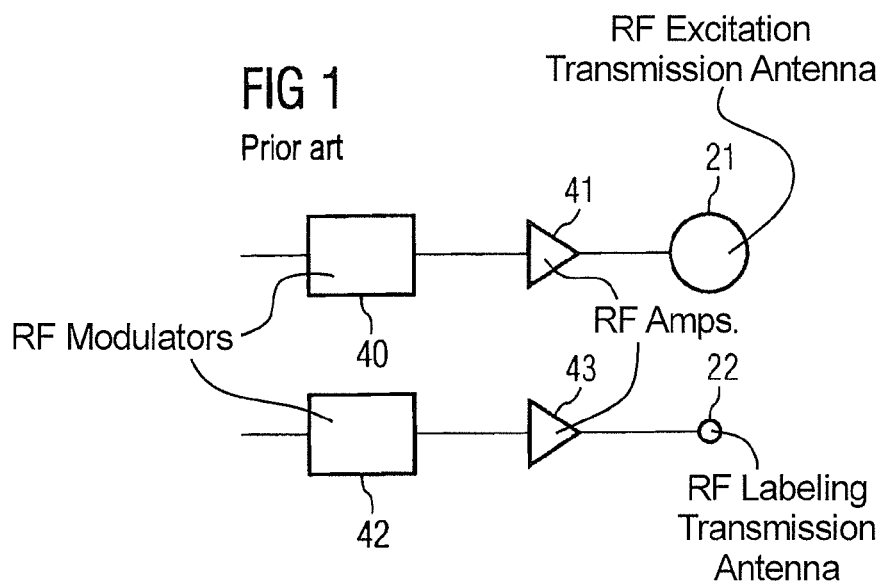
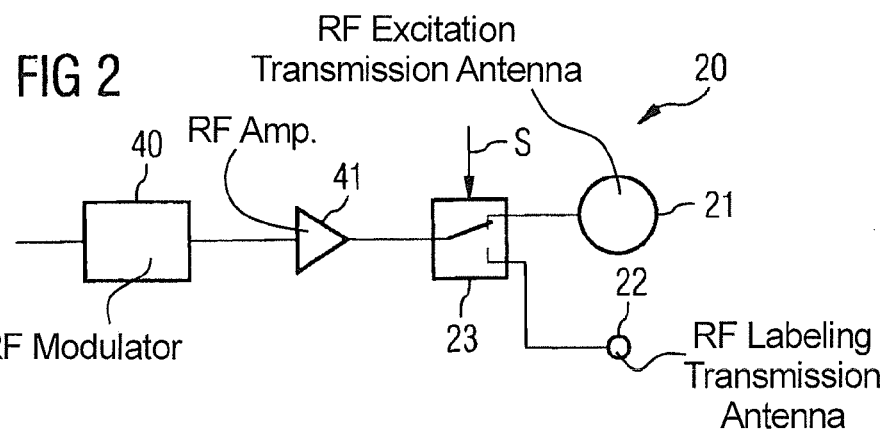
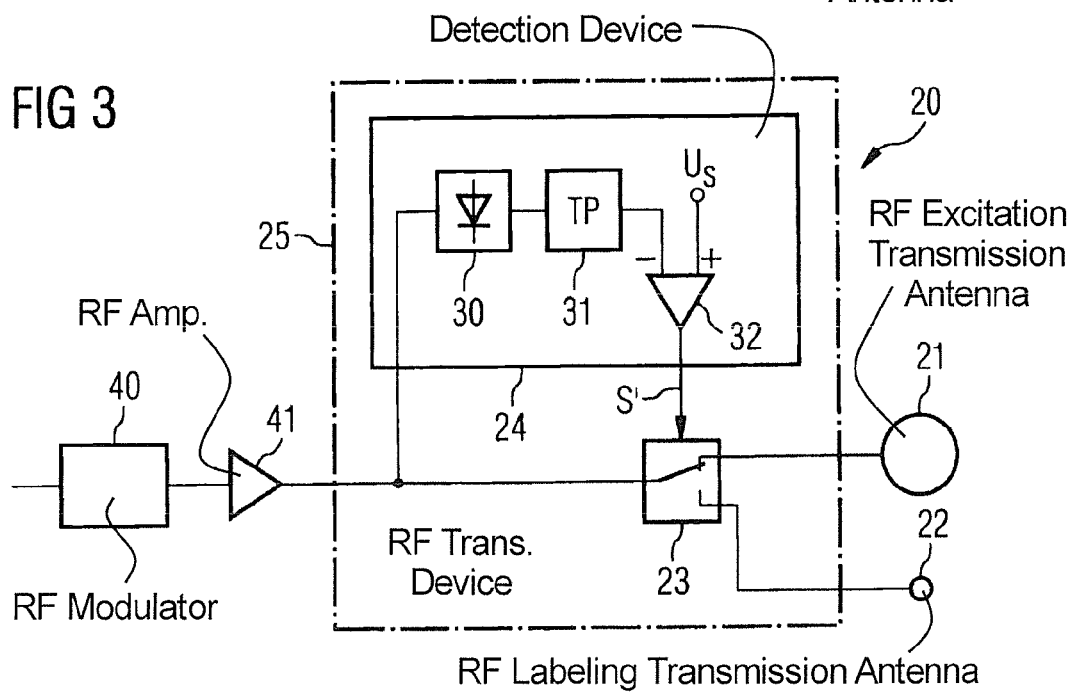

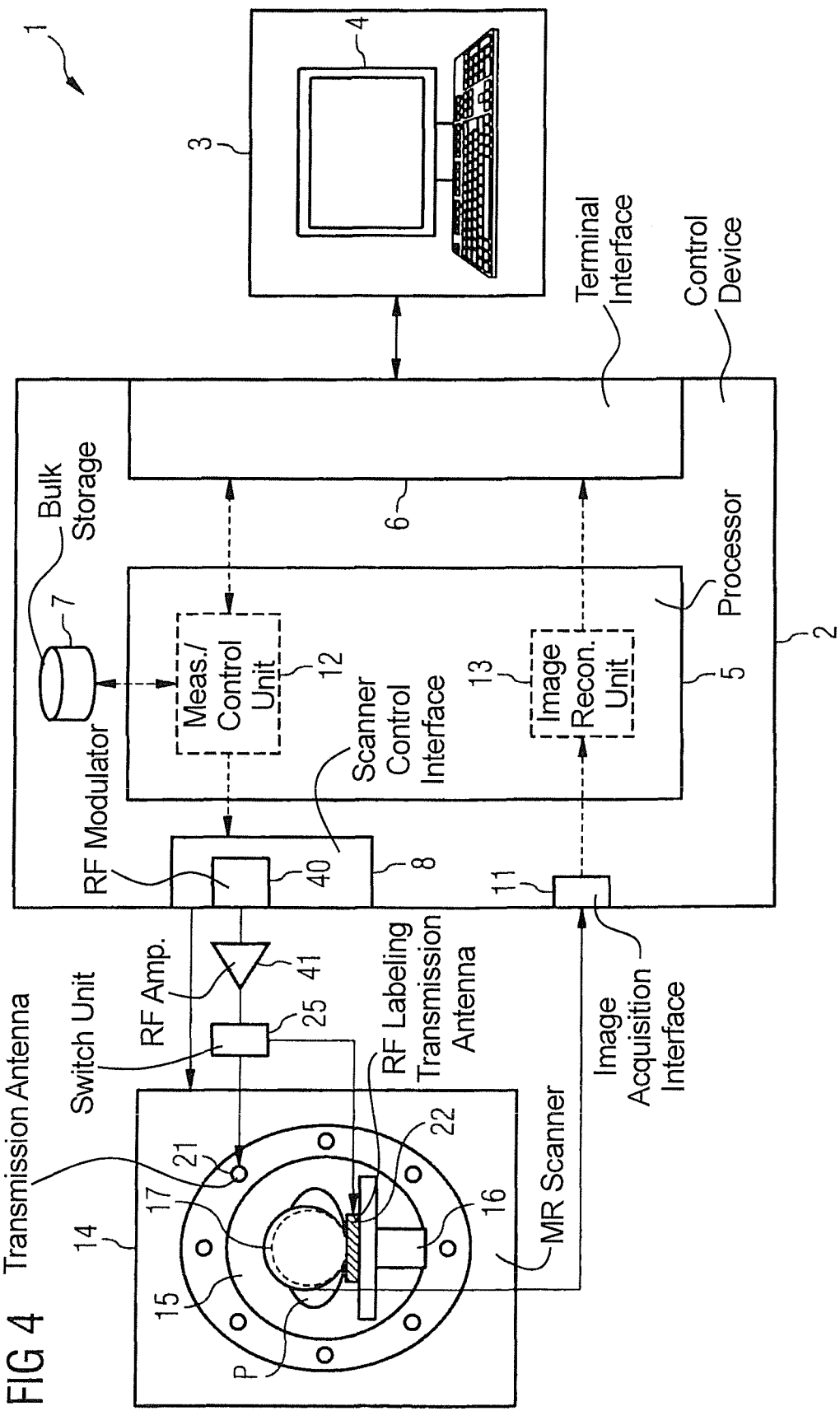

MAGNETIC RESONANCE RF TRANSMISSION ARRANGEMENT AND METHOD WITH COMMONLY FED LABELING AND EXCITATION ANTENNAS

BACKGROUND OF THE INVENTION

1. Field of the Invention

The present invention concerns a radio-frequency transmission device for a magnetic resonance system to generate magnetic resonance exposures of an examination region of an examination subject of the type having a first radio-frequency transmission antenna to emit radio-frequency signals, a radio-frequency amplifier to supply the first radio-frequency transmission antenna with radio-frequency signals with a predetermined radio-frequency transmission power, and a second radio-frequency transmission antenna which is fashioned to mark a flowing medium in the examination region and/or regions by emission of radio-frequency marking signals, such that the medium is identifiable in the generated magnetic resonance exposures of the examination region. Moreover, the invention concerns a radio-frequency transmission antenna arrangement usable in such a radio-frequency transmission device, as well as a magnetic resonance system with such a radio-frequency transmission device.

Moreover, the invention concerns a method to generate magnetic resonance exposures of an examination region of an examination subject in which, in a magnetic resonance system, radio-frequency signals are emitted in the examination region with a first radio-frequency transmission antenna, and emitted magnetic resonance signals are thereupon received from the region and image data of the examination region are generated based on these, wherein a medium flowing in the examination region and/or regions is marked (via excitation of nuclear spins of the medium by means of radio-frequency marking signals emitted by a second radio-frequency transmission antenna) such that the medium is identifiable in the examination region in the generated magnetic resonance exposures.

2. Description of the Prior Art

Magnetic resonance tomography is a widespread technique to acquire images of the inside of the body of a living examination subject. In order to acquire an image with this method, i.e. to generate a magnetic resonance exposure of an examination subject, the body or a body part of the patient to be examined must initially be exposed to an optimally homogeneous, static basic magnetic field (usually designated the $B_0$ field) which is generated by a basic magnetic field of the magnetic resonance system. During the acquisition of the magnetic resonance images, rapidly switched gradient fields (generated by gradient coils) are superimposed on this basic magnetic field for spatial coding. Moreover, RF signals (for example a radio-frequency pulse or a radio-frequency pulse sequence) of a defined field strength are radiated into the examination subject with a radio-frequency antenna. By means of this RF field (usually designated the $B_1$ field), the nuclear spins of the atoms in the examination subject are excited such that they are deflected from their equilibrium state (which is oriented parallel to the basic magnetic field) an amount known as an "excitation flip angle" and precess around the direction of the basic magnetic field. The magnetic resonance signals thereby generated are acquired by radio-frequency acquisition antennas. The acquisition antennas can be either the same antennas with which the radio-frequency pulses are also radiated or separate acquisition antennas. The magnetic resonance images of the examination subject are generated on the basis of the acquired magnetic resonance signals. Every pixel in the magnetic resonance image is thereby associated with a small body volume (known as a "voxel"), and every brightness or intensity value of the pixels is linked with the signal amplitude of the magnetic resonance signals acquired from this voxel.

A particularly groundbreaking development of classical magnetic resonance imaging involves techniques in which the performance of marked blood in the brain is acquired with the use of a magnetic resonance apparatus. The blood supply in any arbitrary region of the brain can be determined by a subtraction of two images, one with marked blood and one without marking. Brain activities therefore can be mapped, or variations of the blood flow in pathological cases (such as given strokes, for example) can be detected. The observation of the performance of blood or other marked bodily fluids can also be reasonable in other organs in order in particular to be able to more easily detect pathological cases.

The marking of the blood has conventionally been conducted by the use of exogenous contrast agent based on gadolinium or the like. In order to able to forego the administration of such contrast agent, a technique known as the "ASL technique" (ASL=Arterial Spin Labeling) was developed, which is in particular used in the examination of the brain. The arterial blood is thereby electromagnetically marked (or "labeled") by special excitation of the nuclear spins of the blood (for example in the neck region) before it reaches the brain. An image is acquired after a certain time period in which the blood labeled in this manner has distributed in the brain.

As described above, for this purpose a first radio-frequency antenna is required with which the "normal" imaging radio-frequency signals required for the magnetic resonance acquisition are emitted into the examination region, for example the head region of the patient or test subject. For example, this radio-frequency transmission antenna can be a "whole-body antenna" permanently installed in the magnetic resonance scanner and enclosing the examination space. It can also be a local antenna (for example a head coil) which is placed on the patient like a helmet during the examination. In such examinations it is possible to use the whole-body coil to emit the pulses and the head coil only to receive the magnetic resonance signals. The head coil, however, can also be used to send the radio-frequency signals and to acquire the magnetic resonance signals. The first transmission antenna which serves to emit the imaging radio-frequency pulses is designated in the following as an "imaging transmission antenna" or "imaging transmission coil".

An additional second radio-frequency transmission antenna (designated as a "marking antenna" or "marking coil" in the following) that emits the radio-frequency signals used for the marking can be used for application of the ASL technique. This marking antenna is typically directly arranged locally on the examination subject, for example as close as possible to a suitable artery of the patient. It is usually a relatively small radio-frequency transmission antenna. An example of such a use of an additional radio-frequency transmission antenna for the implementation of a continuous ASL measurement is found in the article by Talagala S. L., Ye F. Q., Ledden P. J. and Chesnick S., "Whole-brain 3D performance MRI at 3.0 T using CASL with a separate labeling coil" in Magn Reson Med 2004:52(1):131-140.

However, present commercial magnetic resonance systems have only one radio-frequency transmission channel with a radio-frequency signal modulator and a downstream radio-frequency amplifier that is used to feed the imaging transmission antenna. In such apparatuses the question arises as to how the separate labeling antenna should be fed. As also described in the aforementioned publication, the marking antenna has conventionally been fed with an additional radio-frequency amplifier. This is shown in FIG. 1. Here a first modulator 4 and a first radio-frequency amplifier 3 exist in parallel for the first (the imaging) radio-frequency transmission coil 1. A separate modulator 6 and a separate radio-frequency amplifier 5 are available for the second radio-frequency transmission antenna 2 or, respectively, the labeling antenna 2. Significant additional costs thereby arise.

SUMMARY OF THE INVENTION

An object of the present invention is to provide an alternative radio-frequency transmission device, a suitable radio-frequency transmission antenna arrangement as well as a magnetic resonance system and a method for generation of magnetic resonance exposures, which allow a simpler and more cost-effective implementation of ASL measurements.

A radio-frequency transmission device of the aforementioned type is fashioned according to the invention so that the second radio-frequency transmission antenna is coupled with the radio-frequency amplifier to supply the first radio-frequency transmission antenna so that this radio-frequency amplifier likewise supplies the second radio-frequency transmission antenna for the emission of the radio-frequency labeling signals with suitable radio-frequency signals with a predetermined radio-frequency transmission power.

The invention is based on the recognition that the labeling antenna must emit radio-frequency pulses to label the medium (for example the arterial blood) only before an acquisition of magnetic resonance images. This is due to the fact that a long time period must be allowed to elapse until the medium has propagated in the region of interest in order to then acquire knowledge about its propagation. The imaging radio-frequency transmission antenna and the labeling antenna therefore do not have to be operated simultaneously. Through a suitable coupling, it is thus possible for the radio-frequency amplifier (or possibly even the complete radio-frequency transmission channel, i.e. the amplifier as well as modulators and additional components required for the generation of the radio-frequency signals) to be used for both transmission antennas. By supplying the first imaging transmission antenna and the second labeling transmission antenna with suitable radio-frequency signals by means of a common (same) radio-frequency amplifier, a second radio-frequency amplifier can consequently be foregone. In addition to the cost savings, the invention thus also allows a simple retrofitting of existing, conventional magnetic resonance systems to implement ASL measurements and similar methods in which a marking of a medium flowing in the examination region is required.

For this purpose, a magnetic resonance system according to the invention must only have a radio-frequency transmission device according to the invention in addition to the typical components.

In a particularly simple embodiment, the first radio-frequency transmission antenna and the second radio-frequency transmission antenna are coupled with a common radio-frequency amplifier via a change-over switch. Either the first radio-frequency transmission antenna or the second radio-frequency transmission antenna can then be selectively charged with radio-frequency signals by the radio-frequency amplifier via this change-over switch.

This transmission change-over switch (which should advantageously be very fast) can be switched via a suitable signal. This signal can be automatically output within the measurement workflow by a controller of the magnetic resonance system. For example, this can be predetermined for the respective measurements in a measurement protocol on the basis of which the control of a specific measurement ensues.

In a preferred embodiment, the radio-frequency transmission device has a detection device coupled with the radio-frequency amplifier and the change-over switch, which detection device is fashioned in order to detect one or more specific features of a radio-frequency signal coming from the radio-frequency amplifier and to switch over to a specific switching state upon detection of specific feature or a specific feature combination. Typically, it is such that the envelope of the radio-frequency pulses serving for labeling clearly differs from the envelope of the imaging radio-frequency pulses. For example, pulses known as sinc pulses with relatively high amplitude are required, in contrast to which the labeling radio-frequency pulses can be small square wave signals with lower amplitude.

For example, a rise response or a maximum amplitude of the envelope of the radio-frequency signals can therefore be detected as one or more specific features. The change-over switch is then switched dependent on this and charges either the imaging radio-frequency transmission antenna or the labeling antenna with the signals. The change-over signal then no longer has to be provided by the magnetic resonance system, and a retrofitting is possible even more simply.

In the normal state, the change-over switch is preferably in a switching state in which the labeling coil is charged with the radio-frequency signals so that, given the typically used radio-frequency labeling frequency signals in the form of small square wave signals, no change-over switching is necessary and thus no signal portion is cut off, even if the change-over switch has a delay associated therewith. Given the significantly stronger pulses for imaging, such a short delay time plays no role insofar as a suitably rapid switch is used. Suitable quick switches are known from F. Tinz, "Entwicklung elektronischer HF-Leistungsumschalter mit PIN-Dioden", degree dissertation, Fachhochschule Nürnberg, 1993, for example.

In a preferred embodiment, the second radio-frequency transmission antenna is coupled with an induction coil or "injection coil" that receives the radio-frequency signals emitted by the radio-frequency amplifier via the first radio-frequency transmission antenna (and thereby receives transmission power) and relays it to the second radio-frequency transmission antenna which then emits corresponding radio-frequency signals. This means that the radio-frequency signals emitted by the radio-frequency amplifier via the first radio-frequency transmission antenna are received by means of an induction coil and relayed to the second labeling antenna, which then emits the corresponding radio-frequency labeling signals.

Given the use of such an induction coil, a direct coupling of the marking coil with the existing radio-frequency amplifier of the magnetic resonance system can be foregone. This means no mechanical intervention in the magnetic resonance system whatsoever is necessary.

In addition to the radio-frequency transmission antenna that is fashioned to emit the radio-frequency labeling signals, a radio-frequency transmission antenna arrangement of such a design according to the invention has an induction coil coupled with the radio-frequency transmission antenna, this induction coil receiving radio-frequency signals emitted by an radio-frequency amplifier via another radio-frequency transmission antenna independent of the radio-frequency transmission antenna arrangement, and relaying these radio-frequency signals to the radio-frequency transmission antenna of the radio-frequency transmission antenna arrangement, which then emits corresponding radio-frequency signals. This radio-frequency transmission antenna arrangement serves so to speak as a "$B_1$ field concentrator" or as a "magnifier coil" that captures the field emitted by the imaging radio-frequency transmission antenna, concentrates it, and emits it again at the labeling coil.

The second radio-frequency transmission antenna is advantageously coupled via an activation switch with the induction coil, which is fashioned such that the radio-frequency signals received by the induction coil are relayed to the second radio-frequency transmission antenna in an activation switch state and not in a deactivation switch state.

A suitable activation or deactivation signal can be supplied by a control unit of the magnetic resonance system. Another possibility also is for the activation switch to be switched with the use of a detection device that is fashioned to detect one or more features of a radio-frequency signal received by the induction coil and to switch the activation switch to a specific switch state given a detection of a specific feature or of a specific feature combination. This means that the control signal for the activation switch is ultimately also derived from the envelope of the injected signal. In this case, the radio-frequency transmission antenna arrangement according to the invention can operate without any cable connection with the rest of the MR system, such that an extremely easy retrofitting of existing magnetic resonance systems is possible.

BRIEF DESCRIPTION OF THE DRAWINGS

FIG. 1 schematically shows a first radio-frequency transmission antenna (imaging transmission antenna) and a second radio-frequency transmission antenna (labeling antenna) as well as their typical feed via separate modulators and radio-frequency amplifiers, according to the prior art.

FIG. 2 schematically shows representation of a first exemplary embodiment of a radio-frequency transmission device according to the invention.

FIG. 3 schematically shows an embodiment of the radio-frequency transmission device according to FIG. 2.

FIG. 4 schematically shows an exemplary embodiment of a magnetic resonance tomography system with a radio-frequency transmission device according to FIG. 3.

Figure 5:
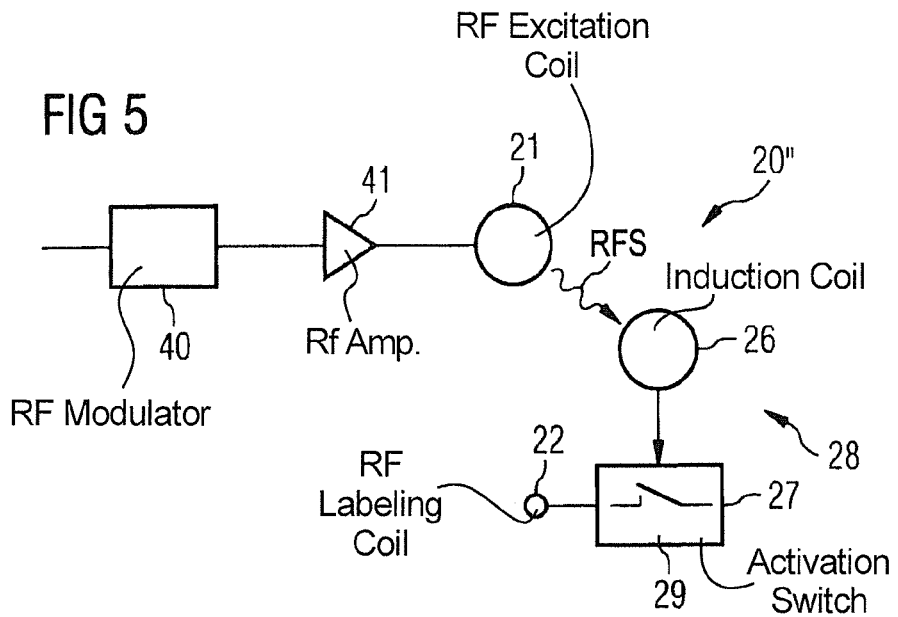
FIG. 5 schematically shows another exemplary embodiment of a radio-frequency transmission device according to the invention.

DESCRIPTION OF THE PREFERRED
EMBODIMENTS

The conventional design presented in FIG. 1, with two separate modulators 40, 42 and radio-frequency amplifiers 41, 43 for the imaging radio-frequency transmission antenna and for the labeling antenna, was explained above.

In contrast to this, FIG. 2 shows a very simple embodiment of a design according to the invention of a radio-frequency transmission device 20. The modulator 40 and the radio-frequency transmission amplifier 41 for the first imaging transmission antenna 21 thereby remain unchanged. A change-over switch 23 with two outputs is merely switched between the output of the radio-frequency transmission amplifier 41 and the input of the imaging transmission antenna 21. The imaging transmission antenna 21 is connected to the first output and the labeling antenna 22 is connected to the second output.

This change-over switch 23 (which is a very fast change-over switch) can be switched between a first switch state and a second switch state via a signal S. The switch 23 advantageously is normally in the rest setting in the position wherein the labeling antenna 22 is connected with the radio-frequency amplifier 41. If imaging radio-frequency pulses should be emitted, a switch to the imaging transmission antenna 21 ensues. This has the advantage that a change-over switching is no longer necessary (and thus no signal portions are lost) given the typically used marking pulses which have a relatively small amplitude and exhibit a square wave.

In the embodiment according to FIG. 2, the change-over signal S for the change-over switch 23 is provided by a control unit of the magnetic resonance system.

FIG. 3 shows a further-developed radio-frequency transmission device 20' in which such an external control signal S can be foregone and the change-over switch 23 is instead switched with a control signal S' which is generated by means of a detection device 24. This detection device 24 detects specific properties of the radio-frequency signal coming from the radio-frequency amplifier 41. Namely, normal radio-frequency transmission pulses for imaging and radio-frequency labeling pulses normally have different properties. The typically differ in amplitude, shape (sinc shape or, respectively, square wave shape) or the rise times of the rise edges. These different properties can be detected and the change-over switch 23 can be suitably controlled based on these.

The detection device 24 and the change-over switch 23 can be integrated into a change-over switch module 24.

In the radio-frequency transmission device 20 shown in FIG. 3, the detection device 24 is a small circuit with three components. A first component is a rectifier 30. A low-pass filter 31 follows this. The envelope of the radio-frequency signal coming from the radio-frequency power amplifier 41 is determined via the rectifier and low-pass filters. This envelope is then compared in a comparator 32 with an (advantageously adjustable) threshold voltage $U_S$.

To provide the threshold voltage $U_S$, the detection device 24 can have, for example, an internal power supply (for example a small cell or a battery). If the amplitude of the envelope of the radio-frequency signal is greater than the threshold $U_S$, the switch 23 is connected via a control signal S' so that the radio-frequency signal is conducted to the imaging first radio-frequency antenna 21. Otherwise, the change-over switch 23 is located in a switching state in which the radio-frequency signal is conducted to the labeling coil 2.

Alternatively, another circuit design can also be used as a detection device depending on which features or feature combinations of the signal should be detected. Since some time is required for the detection of the signal, a delay can be fashioned (for example via a corresponding line length) between the tap on the line coming from the radio-frequency amplifier 42 to the detection device 24 and the change-over switch 23, which delay takes into account the detection time and the small dead time of the change-over switch 23 so that no signal portions (or at most very small signal portions) are truncated upon switching over.

FIG. 4 shows a simple principle block diagram of a magnetic resonance system 1 with a radio-frequency transmission device according to FIG. 3. The core of this magnetic resonance system is a scanner 14 in which a patient P is positioned on a bed 16 in a cylindrical examination space 15. A radio-frequency whole-body transmission antenna arrangement 21 (for example a birdcage antenna) is located inside the scanner 14 to emit the magnetic resonance radio-frequency pulses, i.e. to emit the $B_1$ field. It is hereby a commercially available scanner 14.

The scanner 14 is controlled by a control device 2. A terminal 3 (or, respectively, an operator console) via which an operator can operate the control device 2 (and therefore the scanner 14) is connected to the control device 2 via a terminal interface 6. The control device 2 is connected with the scanner 14 via a tomograph control interface 8 and an image acquisition interface 11. The corresponding control commands are output to the scanner 14 via the tomograph control interface 8 so that the desired pulse sequences are emitted, i.e. the radio-frequency pulses and the gradient pulses for the gradient coils (not shown) to generate the desired magnetic fields. The raw data are acquired via the image data acquisition interface 11, meaning that the acquired magnetic resonance signals are read out.

Both the control device 2 and the terminal 3 can also be integral components of the scanner 14.

The control device 2 moreover has a bulk storage 7 in which generated image data can be saved and measurement protocols can be stored, for example.

The entire magnetic resonance system 1 moreover also possesses all additional, typical components or, respectively, features such as, for example, interfaces for connection to a communication network that, for example, is connected with an image information system (PACS, Picture Archiving and Communication System) or offers connection possibilities for external data stores. However, these components are not all shown in FIG. 4 for clarity reasons.

A central point in the control device 2 is a processor 5 in which various control components are realized in the form of software. At this point, it is noted that such a control device 2 can naturally also possess a number of processors networked with one another at which the various control components are realized (for example in the form of program modules).

Such a component is the measurement/control unit 12 with which the user can communicate via the terminal 3. This measurement control unit 12 controls the scanner 14 via the scanner control interface 8 and provides for the emission of the desired radio-frequency pulse sequences by the radio-frequency antenna arrangement 21 (based on the parameter values stored in the measurement protocols and possibly modified or, respectively, provided by the operator) and furthermore ensures that the gradients are switched in a suitable manner in order to implement the desired measurements.

The measurement data arriving via the image acquisition interface 13 are conducted to an additional component (an image reconstruction unit 13) realized on the processor 5, which image reconstruction unit 13 correspondingly processes the raw data. The image reconstruction unit 13 implements a Fourier transformation of the raw data and therefore provides for a reconstruction of images. The images can then be additionally prepared and displayed to the operator (for example on a screen 4 of the terminal 3) or also be stored in the bulk storage 7.

Moreover, a head coil 17 with which the magnetic resonance signals can be acquired has been placed on the head of the patient P for the implementation of an ASL examination in the brain of the patient. A labeling coil 22 is additionally located in the neck region of the patient. In the design shown in FIG. 4, the head coil 17 merely serves to receive the magnetic resonance signals that are sent back from the head region of the patient P in reaction to an excitation signal. The head coil 17 is therefore connected to the image data acquisition interface 11. For excitation, a radio-frequency field is emitted with the whole-body coil 21 which is connected to a radio-frequency amplifier 42. This radio-frequency amplifier 42 is in turn connected with a radio-frequency signal modulator 41 which here is part of the tomograph control interface 8 of the control device 2. Both the radio-frequency modulator 41 and the radio-frequency amplifier 42 can be typical components. Given corresponding control by the measurement/control unit, a matching radio-frequency signal is sent via the radio-frequency modulator 41 to the radio-frequency amplifier 42 which amplifies the signal. The amplification (i.e. ultimately the transmission amplitude) that is generated by the radio-frequency amplifier 42 is also predetermined by the control device 2. An additional arrow leading from the tomograph interface 8 to the scanner 14 should merely symbolize the additional control commands to control the gradient coils, the table feed, etc. via the control device 2.

According to the invention (as has been shown in FIG. 3), at the output of the radio-frequency amplifier 42 a switching unit 25 is connected with a detection device 24 and a change-over switch 23 which provide for the inventive switching over from the output of the radio-frequency amplifier 42 to the imaging radio-frequency transmission coil 21 or to the labeling antenna 22.

This switching unit 25 can, for example, also be integrated into the radio-frequency amplifier 42 or, respectively, all components can also be integrated directly into the control device 2. An integration of this switching unit 25 into the scanner 14 is likewise possible.

As already explained, in principle it is also possible to use the head coil 17 not only as an acquisition coil but also as an imaging transmission coil. The magnetic resonance system 1 typically possesses a corresponding output to which the head coil 17 can also be connected to transmit the imaging radio-frequency pulses. It can then be set whether the body coil or the head coil is used to transmit the radio-frequency pulses for an examination. Alternatively, instead of a head coil 17 other local coils can also naturally be used in other regions. Given use of such a head coil or other local coil, the switching unit 25 can, for example, also be directly integrated into the head coil 17 or the respective local coil, and the appertaining head coil or local coil can have the output for connection of a labeling coil 22.

Figure 6:
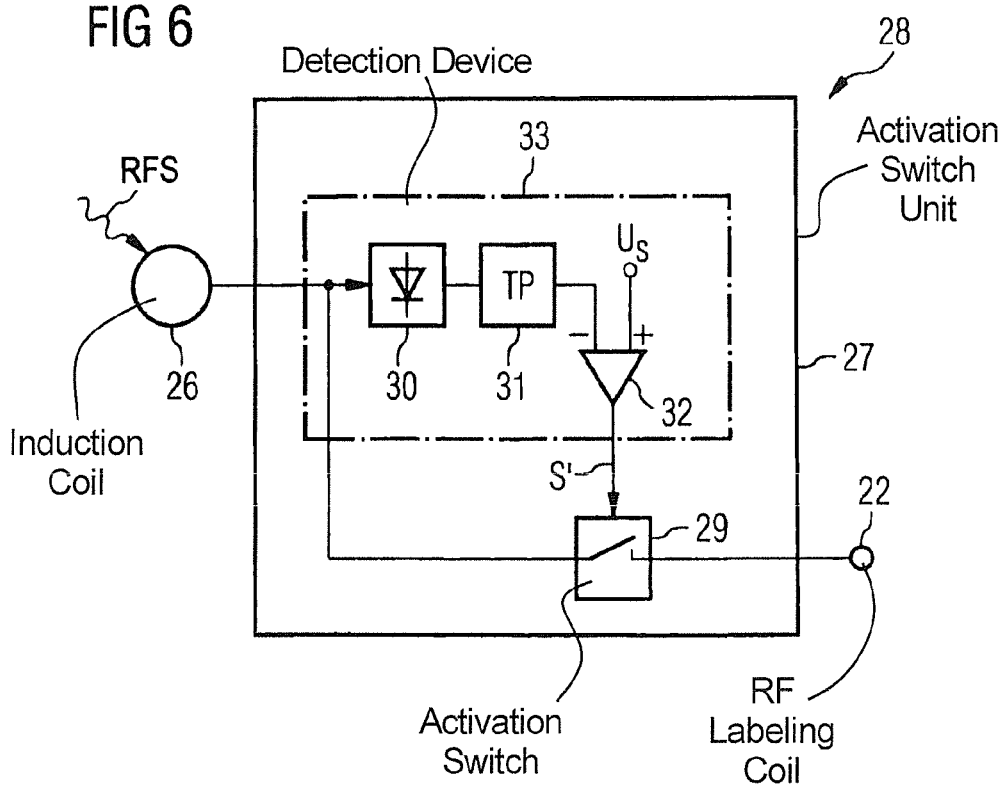
FIG. 6 is a more detailed, schematic representation of an exemplary embodiment of a radio-frequency transmission antenna arrangement usable in the radio-frequency transmission device according to FIG. 5.

Another variant of a radio-frequency transmission device 20" according to the invention is shown in FIGS. 5 and 6. This variant can operate entirely without a plug connection with the magnetic resonance system 1 itself or its radio-frequency transmission system.

The principle is best shown in FIG. 5. Here, as in the prior art according to FIG. 1, the typical imaging transmission coil 21 is connected with the radio-frequency amplifier 41 without an interconnected change-over switch, which radio-frequency amplifier 41 is supplied with the desired radio-frequency signals by a radio-frequency signal modulator 40. Instead of this, a special transmission antenna arrangement 28 is used to emit the labeling pulses, as shown in greater detail in FIG. 6.

This transmission antenna arrangement 28 is formed of an induction coil 26 that receives the radio-frequency signal RFS emitted by the imaging transmission antenna 21 and relays it to the labeling antenna 22 insofar as an activation switch 29 located in the activation switch unit 27 is located in a specific switch state. This activation switch unit 27 has a detection device 33 which can be designed analogous to the detection device 24 in the exemplary embodiment according to FIG. 3. Another explanation of this circuit is therefore foregone.

This detection device 33 detects whether the envelope of the radio-frequency signal RFS emitted by the induction coil 26 lies below or above a specific threshold, and then correspondingly switches the labeling coil 22 to active if the amplitude lies below the threshold $U_S$, or switches the labeling coil 22 to inactive if the amplitude of the received radio-frequency signal RFS lies above the threshold $U_S$.

Through the invention it is achieved that no second RF transmission path including an RF amplifier is necessary for ASL measurements, due to an innovative coupling of the labeling coil with the radio-frequency amplifier of the imaging transmission coil either via a fast change-over switch or via an inductive feed via an injection or, respectively, induction coil. In the last embodiment described, the labeling coil can even be operated without a single cable connection to the magnetic resonance system, and thus can be used in conventional magnetic resonance systems without retrofitting.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency transmission device for a magnetic resonance system, comprising:
   a first radio-frequency antenna configured to emit radio-frequency excitation signals in an examination region of a subject to excite nuclear spins in the subject to produce a magnetic resonance image of the examination region;
   a second radio-frequency antenna configured to emit radio-frequency signals that label nuclear spins in a medium flowing in the examination region by emission of labeling radio-frequency signals, allowing the medium to be identified in said magnetic resonance image of the examination region;
   a radio-frequency amplifier that supplies signals to said first radio-frequency transmission antenna that cause said first radio-frequency transmission antenna to emit said excitation signals;
   said second radio-frequency transmission antenna being coupled with said radio-frequency amplifier and said radio-frequency amplifier also supplying signals to said second radio-frequency transmission antenna, with a predetermined radio-frequency transmission power, that cause said second radio-frequency transmission antenna to emit said radio-frequency labeling signals; and
   an induction coil coupled with said second radio-frequency transmission antenna that receives radio-frequency signals emitted by said radio-frequency amplifier via the first radio-frequency transmission antenna said radio-frequency signals to the second radio-frequency transmission antenna to cause said second radio-frequency transmission antenna to emit said radio-frequency labeling signals.

2. A radio-frequency transmission device as claimed in claim 1 comprising a change-over switch coupling said first radio-frequency antenna and said second radio-frequency antenna with said radio-frequency amplifier.

3. A radio-frequency transmission device as claimed in claim 2 comprising a detection device connected with the radio-frequency amplifier and the change-over switch, said detection device being configured to detect at least one characteristic of an output of said radio-frequency amplifier, and to change a state of said change-over switch, to selectively connect said radio-frequency amplifier to one of said first radio-frequency transmission antenna or said second radio-frequency transmission antenna, dependent on the at least one detected characteristic.

4. A radio-frequency transmission device as claimed in claim 1 comprising an activation switch that couples said second radio-frequency antenna with said induction coil, said activation switch being switchable between an activation state wherein said radio-frequency signals received by the induction coil are relayed to the second radio-frequency transmission antenna, and a deactivation state wherein said radio-frequency signals are not relayed to the second radio-frequency transmission antenna.

5. A radio-frequency transmission device as claimed in claim 4 comprising a detection device configured to detect at least one characteristic of the radio-frequency signal received by the induction coil, and to switch said activation device between said activation state and said deactivation state dependent on the at least one detected characteristic.

6. A magnetic resonance system comprising:
   a magnetic resonance scanner configured to interact with an examination subject to acquire magnetic resonance data from the examination subject;
   a radio-frequency transmission device in said scanner, comprising a first radio-frequency antenna configured to emit radio-frequency excitation signals in an examination region of the subject to excite nuclear spins in the subject to produce said magnetic resonance data of the examination region, a second radio-frequency antenna configured to emit radio-frequency signals that label nuclear spins in a medium flowing in the examination region by emission of labeling radio-frequency signals, allowing the medium to be identified in a magnetic resonance image of the examination region produced from said data, a radio-frequency amplifier that supplies signals to said first radio-frequency transmission antenna that cause said first radio-frequency transmission antenna to emit said excitation signals, and said second radio-frequency transmission antenna being coupled with said radio-frequency amplifier and said radio-frequency amplifier also supplying signals to said second radio-frequency transmission antenna, with a predetermined radio-frequency transmission power, that cause said second radio-frequency transmission antenna to emit said radio-frequency labeling signals; and
   an induction coil coupled with said second radio-frequency transmission antenna that receives radio-frequency signals emitted by said radio-frequency amplifier via the first radio-frequency transmission antenna and relays said radio-frequency signals to the second radio-frequency transmission antenna to cause said second radio-frequency transmission antenna to emit said radio-frequency labeling signals.

7. A method for operating a magnetic resonance system, comprising the steps of:
   from a first radio-frequency antenna, emitting radio-frequency excitation signals in an examination region of a subject to excite nuclear spins in the subject to produce a magnetic resonance image of the examination region;
   from a second radio-frequency antenna, emitting radio-frequency signals that label nuclear spins in a medium flowing in the examination region by emission of labeling radio-frequency signals, allowing the medium to be identified in said magnetic resonance image of the examination region;
   from a radio-frequency amplifier, supplying signals to said first radio-frequency transmission antenna that cause said first radio-frequency transmission antenna to emit said excitation signals;
   coupling said second radio-frequency transmission antenna with said radio-frequency amplifier and so that radio-frequency amplifier also supplies signals to said second radio-frequency transmission antenna, with a predetermined radio-frequency transmission power, that cause said second radio-frequency transmission antenna to emit said radio-frequency labeling signals; and coupling an induction coil with said second radio-frequency antenna and, with said induction coil, receiving radio-frequency signals emitted by said radio-frequency amplifier via the first radio-frequency antenna, and relaying said radio-frequency signals from said induction coil to the second radio-frequency transmission antenna to cause said second radio-frequency transmission antenna to emit said radio-frequency labeling signals.

8. A method as claimed in claim 7 comprising coupling said first radio-frequency antenna and said second radio-frequency antenna with said radio-frequency amplifier via a change-over switch.

9. A method as claimed in claim 8 comprising detecting at least one characteristic of an output of said radio-frequency amplifier, and changing a state of said change-over switch, to selectively connect said radio-frequency amplifier to one of said first radio-frequency transmission antenna or said second radio-frequency transmission antenna, dependent on the at least one detected characteristic.

10. A method as claimed in claim 7 comprising coupling an induction coil with said second radio-frequency transmission antenna and with said induction coil, receiving radio-frequency signals emitted by said radio-frequency amplifier via the first radio-frequency transmission antenna and relaying said radio-frequency signals to the second radio-frequency transmission antenna to cause said second radio-frequency transmission antenna to emit said radio-frequency labeling signals.

11. A method as claimed in claim 10 comprising coupling said second radio-frequency antenna with said induction coil via an activation switch, switching said activation switch between an activation state wherein said radio-frequency signals received by the induction coil are relayed to the second radio-frequency transmission antenna, and a deactivation state wherein said radio-frequency signals are not relayed to the second radio-frequency transmission antenna.

12. A method as claimed in claim 11 comprising detecting at least one characteristic of the radio-frequency signal received by the induction coil, and switching said activation device between said activation state and said deactivation state dependent on the at least one detected characteristic.

* * * * *